US012615035B2

(12) United States Patent
Lin et al.

(10) Patent No.: US 12,615,035 B2
(45) Date of Patent: Apr. 28, 2026

(54) CLOCK SYNTHESIZER

(71) Applicant: Taiwan Semiconductor Manufacturing Company, Ltd., Hsinchu (TW)

(72) Inventors: Wei Shuo Lin, Hsinchu (TW); Wei Chih Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 335 days.

(21) Appl. No.: 17/815,775

(22) Filed: Jul. 28, 2022

(65) Prior Publication Data

US 2024/0039520 A1     Feb. 1, 2024

(51) Int. Cl.
| | |
|---|---|
| *H03K 3/017* | (2006.01) |
| *H03K 5/02* | (2006.01) |
| *H03K 5/156* | (2006.01) |
| *H03L 7/107* | (2006.01) |

(52) U.S. Cl.
CPC ............ *H03K 3/017* (2013.01); *H03K 5/023* (2013.01); *H03K 5/1565* (2013.01); *H03L 7/107* (2013.01)

(58) Field of Classification Search
None
See application file for complete search history.

(56) References Cited

U.S. PATENT DOCUMENTS

| | | | | |
|---|---|---|---|---|
| 9,805,773 B1 * | 10/2017 | Shi | ............................ | H03K 5/05 |
| 10,587,247 B2 * | 3/2020 | Tang | ...................... | H03K 3/017 |
| 2003/0179027 A1 * | 9/2003 | Kizer | .................... | H03L 7/0805 |
| | | | | 327/158 |
| 2004/0160265 A1 * | 8/2004 | Fiedler | .................... | H03L 7/089 |
| | | | | 327/355 |
| 2007/0290730 A1 * | 12/2007 | Dai | ...................... | H03K 5/1565 |
| | | | | 327/175 |
| 2008/0253492 A1 * | 10/2008 | Wang | ........................ | H03L 9/00 |
| | | | | 375/376 |

* cited by examiner

*Primary Examiner* — Menatoallah Youssef
*Assistant Examiner* — Khareem E Almo
(74) *Attorney, Agent, or Firm* — Merchant & Gould P.C.

(57) ABSTRACT

A clock synthesizer is provided. A clock buffer is configured to store an input clock signal. A Duty Cycle Corrector (DCC) circuit is connected to the clock buffer. The DCC circuit is configured to receive the input clock signal from the clock buffer, receive a control signal, and adjust a duty cycle of the input clock signal based on the control signal. An output clock signal comprising the duty cycle corrected input clock signal is generated. The output clock signal is provided. A current source is configured to sink a clamping current to the DCC circuit.

20 Claims, 14 Drawing Sheets

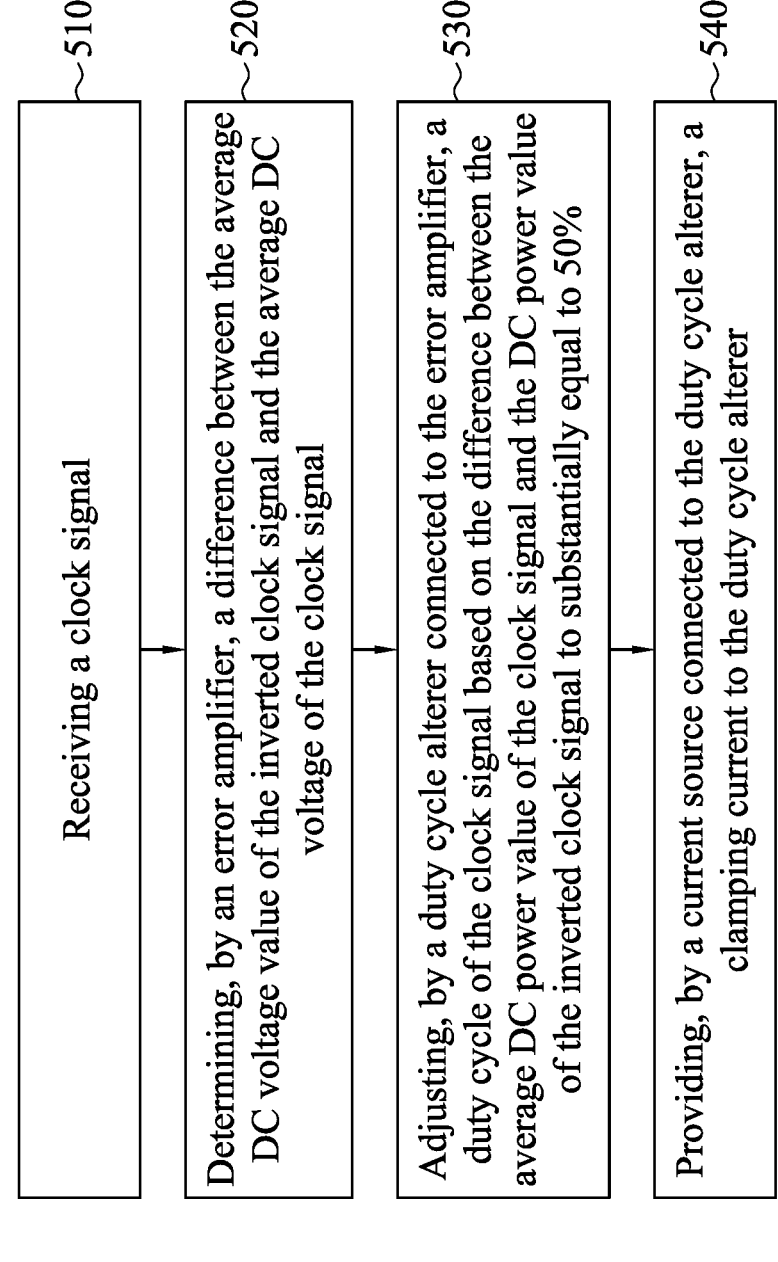

500

510

Receiving a clock signal

520

Determining, by an error amplifier, a difference between the average DC voltage value of the inverted clock signal and the average DC voltage of the clock signal

530

Adjusting, by a duty cycle alterer connected to the error amplifier, a duty cycle of the clock signal based on the difference between the average DC power value of the clock signal and the DC power value of the inverted clock signal to substantially equal to 50%

540

Providing, by a current source connected to the duty cycle alterer, a clamping current to the duty cycle alterer

FIG. 13

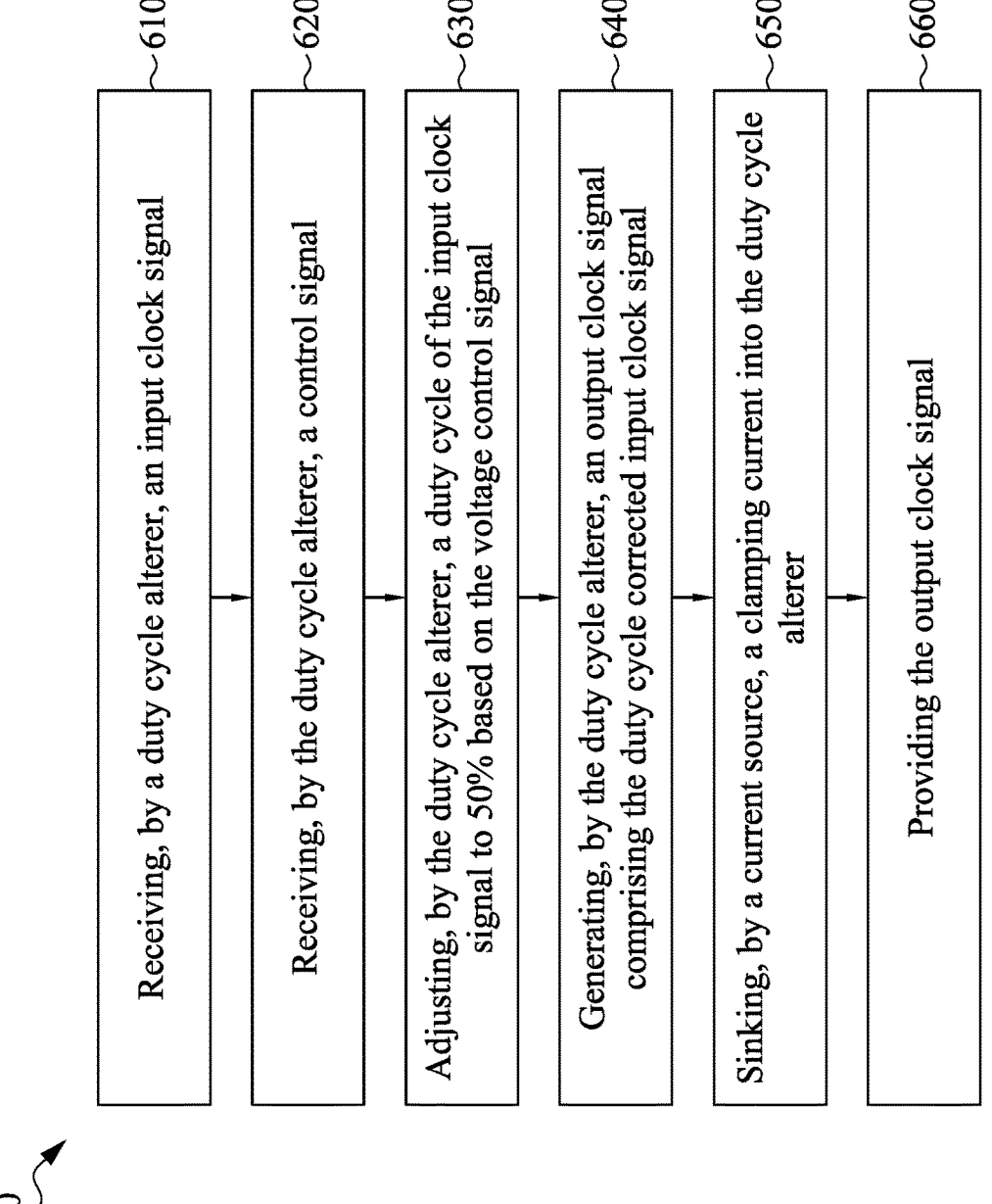

600

610 Receiving, by a duty cycle alterer, an input clock signal

620 Receiving, by the duty cycle alterer, a control signal

630 Adjusting, by the duty cycle alterer, a duty cycle of the input clock signal to 50% based on the voltage control signal 640 Generating, by the duty cycle alterer, an output clock signal comprising the duty cycle corrected input clock signal 650 Sinking, by a current source, a clamping current into the duty cycle alterer 660 Providing the output clock signal

FIG. 14

CLOCK SYNTHESIZER

BACKGROUND

As system clock speeds continue to rise, signal reliability and accuracy have become increasingly important, particularly with respect to amplitude, frequency, and distortion. Providing signals with robust duty cycles has also been desirable, as many digital circuits require a precisely controlled duty cycle for proper operation. Known approaches for correcting duty cycle error and providing cycle corrected clock signals (for example, a clock signal having a 50%) duty cycle typically utilize adjustable delay circuits that are incrementally adjusted until the duty cycle of a clock signal is corrected.

The process of correcting the duty cycle can take a relatively long time, as the iterative adjustment of the delays and the duty cycle error detection can take several hundreds of clock cycles to fully correct duty cycle error. Such approaches may be unable to correct duty cycle error as quickly as may be desired. In addition, such operations require a complicated circuit and incur high power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 13 is a flow diagram of a method for adjusting a phase and a duty cycle of a clock signal in accordance with example embodiments.

FIG. 14 is a flow diagram of another method for adjusting a phase and a duty cycle of a clock signal in accordance with example embodiments.

DETAILED DESCRIPTION

Figure 1:
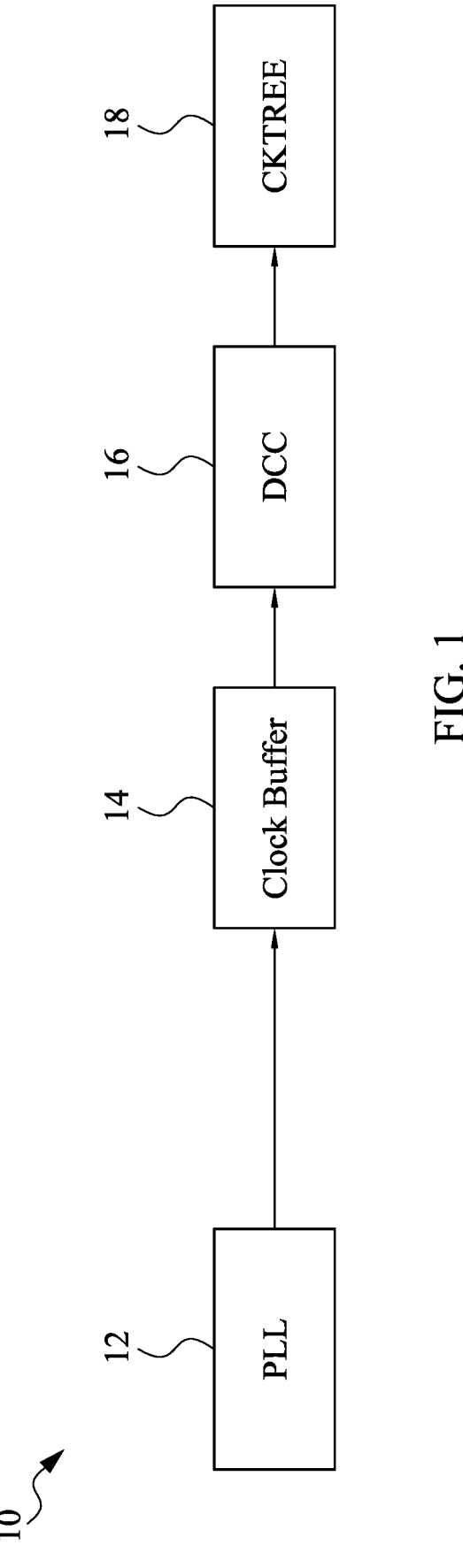
FIG. 1 is a block diagram of a clock synthesizer in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure provides a clock synthesizer that provides a clock signal having a duty cycle of approximately equal to 50%. The clock synthesizer includes a Duty Cycle Corrector (DCC) circuit that adjusts a duty cycle of the clock signal to approximately equal to 50%. FIG. 1 is a block diagram of a clock synthesizer 10 in accordance with some embodiments of the disclosure. Clock synthesizer 10 can provide a clock signal to one or more components of an Integrated Circuit (IC). As shown in FIG. 1, clock synthesizer 10 includes a Phase Locked Loop (PLL) 12 (also referred to as a PLL circuit 12), a buffer 14 (also referred to as a clock buffer 14 or a buffer circuit 14), a DCC circuit 16, and a clock tree 18. In some examples, PLL 102 and clock tree 108 may not be part of clock synthesizer 10. Clock synthesizer 10 can include more elements than shown in FIG. 1.

PLL 12 generates a clock signal based on a reference signal. In examples, PLL 12 is utilized within clock generation and distribution systems of an IC (not shown). PLL 12 generates the clock signal having a phase value that is matched with a phase value of the reference signal. In some examples, PLL 12 generates the clock signal having multiple (that is, m) phase values. For example, PLL 12 generates the clock signal having phase values of 0°, 45°, 90°, 135°, 180°, 225°, 270°, and 315°. PLL 12 provides the clock signal at an output terminal of PLL 12.

Buffer 14 is connected to PLL 12. For example, an input terminal of buffer 104 is connected to the output terminal of PLL 12. Buffer 14 receives and stores the clock signal generated by PLL 12 for a predetermined period of time and provides the stored clock signal at an output terminal. In examples, buffer 14 can be a liner buffer or a circular buffer configured to store the clock signal for the predetermined time period. The predetermined period of time is configurable by configuring a length of buffer 14. A linear buffer includes a plurality of buffers connected to each other in a series. A circular buffer includes a plurality of buffers connected in an end-to-end configuration.

DCC circuit 16 is connected to buffer 14. For example, an input terminal of DCC circuit 16 is connected to the output terminal of buffer 14. DCC circuit 16 receives the clock signal from buffer 14, adjusts the duty cycle of the received clock signal, and provides an output clock signal after the duty cycle adjustment at an output terminal. The output clock signal provided by DCC circuit 16 has a duty cycle of approximately equal to 50%. DCC circuit 16 is discussed in greater detail in the following portions of the disclosure.

Clock tree 18 is connected to DCC circuit 16. For example, an input terminal of clock tree 18 is connected to the output terminal of DCC circuit 16 and receives the output clock signal from DCC circuit 16 provides the output clock signal to one or more components of the IC. Clock tree 18 can include a trunk and a plurality of branches connected to the trunk. The components of the IC can be connected to the plurality of branches.

Figure 2:
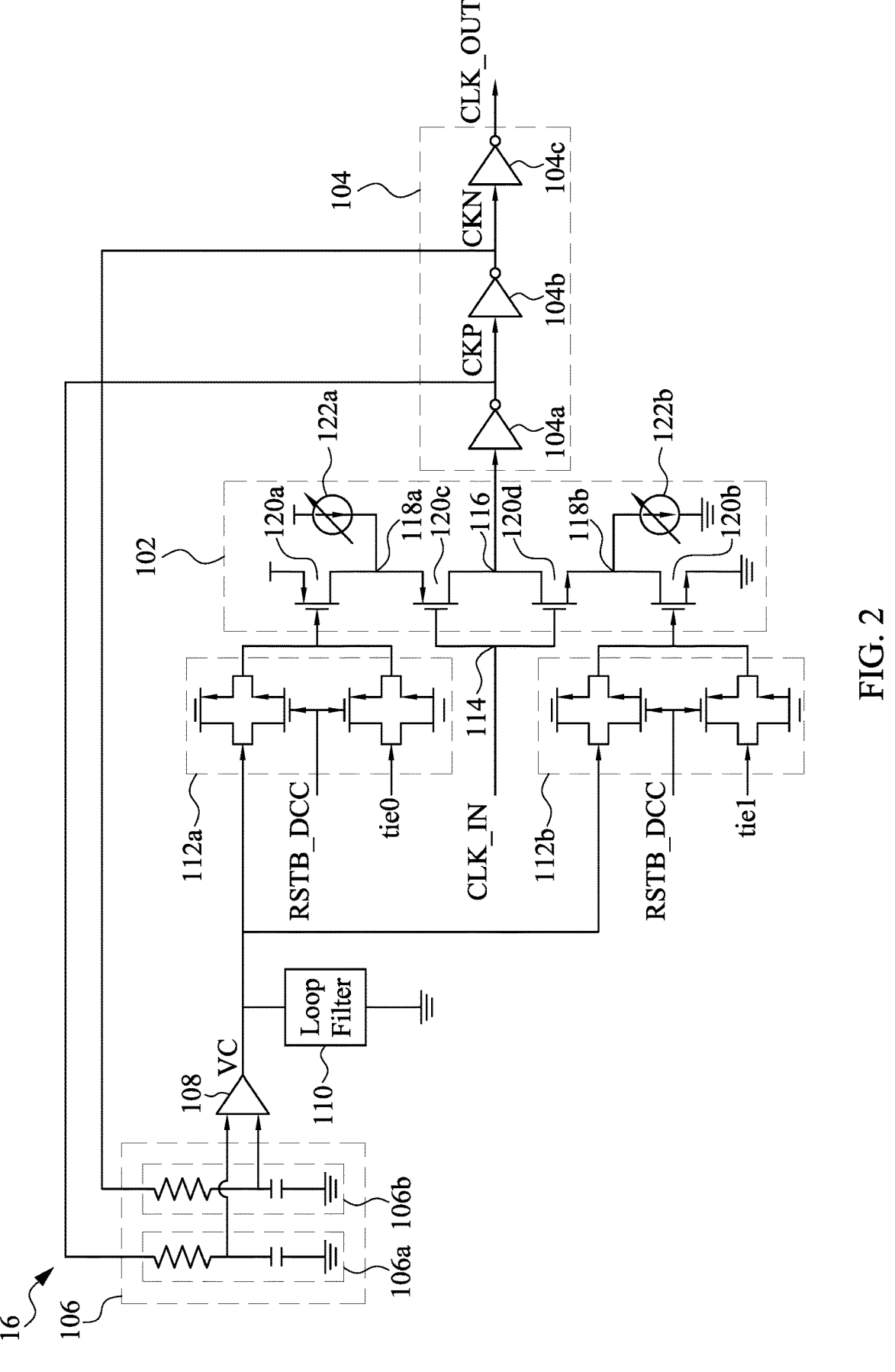
FIG. 2 is a block diagram of a DCC circuit in accordance with some embodiments of the disclosure.

FIG. 2 is a block diagram of DCC circuit 16 in accordance with some embodiments of the disclosure. As shown in FIG. 2, DCC circuit 16 includes a Duty Cycle Alterer (DCA) circuit 102, a plurality of invertors 104 (that is, a first invertor 104a, a second invertor 104b, and a third invertor 104c), a plurality of Direct Current (DC) samplers 106 (that is, a first DC sampler 106a and a second DC sampler 106b), an error amplifier 108, a loop filter 110, and a plurality of bypass circuits 112 (that is, a first bypass circuit 112a and a second bypass circuit 112b). DCA circuit 102 is also referred to as a duty cycle alterer.

DCA circuit 102 receives the input clock signal (represented as CLK_IN) at an input terminal, for example, from PLL 12 through a phase selector. DCA circuit 102 can receive the input clock signal with a preselected phase value, for example, one of 0°, 45°, 90°, 135°, 180°, 225°, 270°, and 315°. DCA circuit 102 adjusts the duty cycle of the input clock signal to be approximately equal to 50% and provides an inverted output clock signal at an output terminal. DCA circuit 102 adjusts the duty cycle of the input clock signal by shifting a rising edge, by shifting a falling edge, or by shifting both the rising edge and the falling edge of the input clock signal. For example, DCA circuit 102 receives the input clock signal having a first rising edge and provides the inverted output clock signal as an output having a second rising edge, the second rising edge being different from the first rising edge.

First invertor 104a is connected to DCA circuit 102. For example, an input terminal of first invertor 104a is connected to the output terminal of DCA circuit 102. First invertor 104a, thus, receives the inverted output clock signal from DCA circuit 102 and inverts the inverted output clock signal to generate an output clock signal (represented as CKP). First invertor 104a provides the output clock signal (CKP) as an output at an output terminal of first invertor 104a.

Second invertor 104b is connected to first invertor 104a. For example, an input terminal of second invertor 104b is connected to the output terminal of first invertor 104a. Second invertor 104b receives the output clock signal (CKP) from first invertor 104a and inverts the output clock signal to generate the inverted output clock signal (represented as CKN). Second invertor 104b provides the inverted output clock signal (CKN) as an output at an output terminal of second invertor 104b.

Third invertor 104c is connected to second invertor 104b. For example, an input terminal of third invertor 104c is connected to the output terminal of second invertor 104b. Third invertor 104c receives the inverted output clock signal (CKN) from second invertor 104b and inverts the inverted output clock signal (CKN) to generate the output clock signal (represented as CLK_OUT). Third invertor 104c provides the output clock signal (CLK_OUT) as an output at an output terminal of third invertor 104c. Each of first invertor 104a, second invertor 104b, and third invertor 104c can be a NOT logic circuit or a NOT logic gate.

First DC sampler 106a is connected to first invertor 104a. For example, an input terminal of first DC sampler 106a is connected to the output terminal of first invertor 104a. First DC sampler 106a determines an average DC voltage value of the output clock signal (CKP) and provides the average DC voltage value of the output clock signal (CKP) at an output terminal of first DC sampler 106a.

Second DC sampler 106b is connected to second invertor 104b. For example, an input terminal of second DC sampler 106b is connected to the output terminal of second invertor 104b. Second DC sampler 106b determines an average DC voltage value of the inverted output clock signal (CKN) and provides the average DC voltage value of the inverted output clock signal (CKN) as an output at an output terminal of second DC sampler 106b. Each of first DC sampler 106a and second DC sampler 106b is a RC circuit having a resistive element and an energy storage device (also referred to as a capacitor) connected to the resistive element.

Error amplifier 108 is connected to both first DC sampler 106a and second DC sampler 106b. For example, a first input terminal of error amplifier 108 is connected to the output terminal of first DC sampler 106a and a second input terminal of error amplifier 108 is connected to the output terminal of second DC sampler 106b. Error amplifier 108 compares the average DC voltage value of the output clock signal (CKP) with the average DC voltage value of the inverted output clock signal (CKN) and provides a voltage control signal (represented as VC) as an output based on the comparison. Error amplifier 108 can include an operational amplifier with differential inputs and a single output. In this configuration, the operation amplifier produces the voltage control signal that is approximately 10,000 times larger than the potential difference between its input terminals.

Loop filter 110 is connected to the output terminal of error amplifier 108. Loop filter 110 filters or suppresses rapid changes in the voltage control signal (VC). In examples, loop filter 110 is a RC circuit with a resistive element and a charge storage device (for example a capacitor) connected to the resistive element. In some examples, loop filter 110 is a low pass filter. A resistance value of the resistive element of loop filter 110 can be in a range of 10 ohm-500K ohm range. However, other values are possible for the resistive element of loop filter 110. A capacitance value of the charge storage device of loop filter 110 can be in a range of 10 f-50 p farads. However, other values are possible for the charge storage device of loop filter 110.

First bypass filter 112a and second bypass filter 112b are connected between error amplifier 108 and DCA circuit 102. First bypass circuit 112a, when activated, can bypass the rising edge adjustment of the input clock cycle during the duty cycle correction. Second bypass circuit 112b, when activated, can bypass the falling edge adjustment of the input clock cycle during the duty cycle adjustment. First bypass circuit 112a can be selectively activated through a tie 0 signal and when activated, first bypass circuit 112a de-activates first transistor 120a of duty cycle alterer 102 thereby bypassing the duty cycle correction of the input clock signal (CLK_IN) through first transistor 120a. Similarly, second bypass circuit 112b can be selectively activated through a tie 1 signal and when activated, second bypass circuit 112b de-activates second transistor 120b of duty cycle alterer 102 thereby bypassing the duty cycle correction of the input clock signal (CLK_IN) through second transistor 120b. Both first bypass circuit 112a and second bypass circuit 112b can be activated together at a same time or can be activated individually at different times.

In examples, first bypass circuit 112a can include a first pass gate configured to pass or block the voltage control signal (VC) and a second pass gate configured to pass or block the tie0 signal. An output terminal of the first pass gate is connected to an output terminal of the second pass gate. Each of the first pass gate and the second pass gate of first bypass circuit 112a is controlled by a RSTB DCC signal. Similarly, second bypass circuit 112b can include a first pass gate configured to pass or block the voltage control signal (VC) and a second pass gate configured to pass or block the tie 1 signal. An output terminal of the first pass gate is connected an output terminal of the second pass gate. Each of the first pass gate and the second pass gate of second bypass circuit 112b is controlled by a RSTB DC signal. Thus, the RSTB DCC can be asserted to selectively bypass the voltage control signal (VC) as desired.

DCA circuit 102 receives the voltage control signal (VC) from error amplifier 108. For example, an input terminal of DCA circuit 102 is connected to the output terminal of error amplifier 108 through first bypass circuit 112a and second bypass circuit 112b. DCA circuit 102 alters or adjusts the duty cycle of the input clock signal (CLK_IN) to be approximately equal to 50% based on the voltage control signal (VC).

DCA circuit 102, for example, adjusts the duty cycle of the input clock signal (CLK_IN) to be approximately equal to 50% by minimizing the difference between the average DC voltage value of the output clock signal (CKP) and the average DC voltage value of the inverted output clock signal (CKN). For example, DCA circuit 102 determines if the difference between the average DC voltage value of the output clock signal (CKP) and the average DC voltage value of the inverted output clock signal (CKN) is equal to zero. In response to determining that the difference between the average DC voltage value of the output clock signal (CKP) and the average DC voltage value of the inverted output clock signal (CKN) is not equal to zero, DCA circuit 102 adjusts the duty cycle of the input clock signal (CLK_IN). For example, DCA circuit 102 decreases the duty cycle of the output clock signal when the difference between the average DC voltage value of the output clock signal and the average DC voltage value of the inverted output clock signal is more than zero (that is, the voltage control signal (VC) is more than a predetermined level). Moreover, DCA circuit 102 increases the duty cycle of the output clock signal when the difference between the average DC voltage value of the output clock signal and the average DC voltage value of the inverted output clock signal is less than zero (that is, the voltage control signal (VC) is less than the predetermined level). Thus, DCA circuit 102 minimizes the difference between the average DC voltage value of the output clock signal and the average DC voltage value of the inverted output clock signal to be substantially equal to zero.

DCA circuit 102 includes an input node 114, an output node 116, a first node 118a, and a second node 118b. In addition, DCA circuit 102 includes a first transistor 120a, a second transistor 120b, a third transistor 120c, and a fourth transistor 120d. A source of first transistor 120a is connected to the supply voltage and a drain of first transistor 120a is connected to a source of third transistor 120c at first node 118a. A drain of third transistor 120c is connected to a drain of fourth transistor 120d at output node 115. A source of fourth transistor 120d is connected a drain of second transistor 120b at second node 118b and a source of second transistor 120b is connected to the ground. A gate of third transistor 120c is connected to a gate of fourth transistor 120c at input node 114. Third transistor 120c and fourth transistor 120d form an invertor between input node 114 and output node 116. A gate of first transistor 120a is connected to an output terminal of first bypass circuit 112a. A gate of second transistor 120b is connected to an output terminal of second bypass circuit 112b.

In examples, first transistor 120a and third transistor 120c are p-channel Metal Oxide Semiconductor (PMOS) transistors and second transistor 120b and fourth transistor 120d are n-channel Metal Oxide Semiconductor (NMOS) transistors. However, other types of transistors are within the scope of the disclosure. Moreover, each of first transistor 120a, second transistor 120b, third transistor 120c, and fourth transistor 120c are symmetrical. That is, a drain of each of first transistor 120a, second transistor 120b, third transistor 120c, and fourth transistor 120d can be a source and a source of each of first transistor 120a, second transistor 120b, third transistor 120c, and fourth transistor 120d can be a drain.

First transistor 120a and second transistor 120b alter the duty cycle of the input clock signal (CLK_IN) based on the voltage control signal (VC). The voltage control signal (VC) generated by error amplifier 108 is provided at the gate of each of the first transistor 120a and second transistor 120b. The duty cycle is modified by manipulating a drain-to-source resistance value of first transistor 120a, second transistor 120b, or both first transistor 120a and second transistor 120b.

For example, when the voltage control signal (VC) is more than a predetermined level, then the drain-to-source resistance value of first transistor 120a is increased and/or the drain-to-source resistance value of second transistor 120b is decreased to decrease the duty cycle of the input clock signal (CLK_IN)). In addition, when the voltage control signal (VC) is less than the predetermined level, then the drain-to-source resistance value of first transistor 120a is decreased and/or the drain-to-source resistance value of second transistor 120b is increased to increase the duty cycle of the input clock signal (CLK_IN).

DCA circuit 102 further includes a first current source 122a and a second current source 122b. First current source 122a is connected parallel to first transistor 120a and sinks or provides a first current at first node 118a. Second current source 122b is connected parallel to second transistor 120b and sinks or provides a second current at second node 118b. Sinking of the first current at first node 118a and second current at second node 118b avoids disappearance of the output clock signal (CLK_OUT) when the voltage control signal (VC) is too high or too low. In addition, first current source 122a and second current source 122b improve a linear relationship between the voltage control signal (VC)

and the duty cycle for DCC circuit 16. Improvement in the linear relationship provides a better control over the duty cycle adjustment.

Each of first current source 122a and second current source 122b can be a static current source or an adaptive current source. FIG. 3A is a diagram of first current source 122a in a static current configuration, also referred to as static clamping current configuration. As shown in FIG. 3A, first current source 122a includes a plurality of first transistors 130, that is, a first first transistor 130[1], a second first transistor 130[2], . . . , and nth first transistor 130[n]. Plurality of first transistors 130 are connected in series between a supply voltage and first node 118a. For example, a source of first first transistor 130[1] is connected to the supply voltage and a drain of first first transistor 130[1] is connected to a source of second first transistor 130[2], continuing to nth first transistor 130[n] whose drain is connected to first node 118a. A gate of each of plurality of first transistors 130 is connected to tie 0 signal. In examples, each of plurality of first transistors 130 are symmetrical and are PMOS transistors. However, other types of transistors may be used.

A resistance value of plurality of first transistors 130 is in a range of 1K-100M ohms. However, other values are possible for the resistance value of first transistor 130. When the tie 0 signal rises to a logic high, each of plurality of first transistors 130 is switched ON generating the first current that is provided at first node 118a. In examples, the first current that is provided at first node 118a by first current source 122a is in a range of 1 n-10 u amperes. However, other values are possible for the first current being provided by at first node 118a. The first current can be varied by varying a number of transistors in plurality of first transistors 130.

Figure 3B:
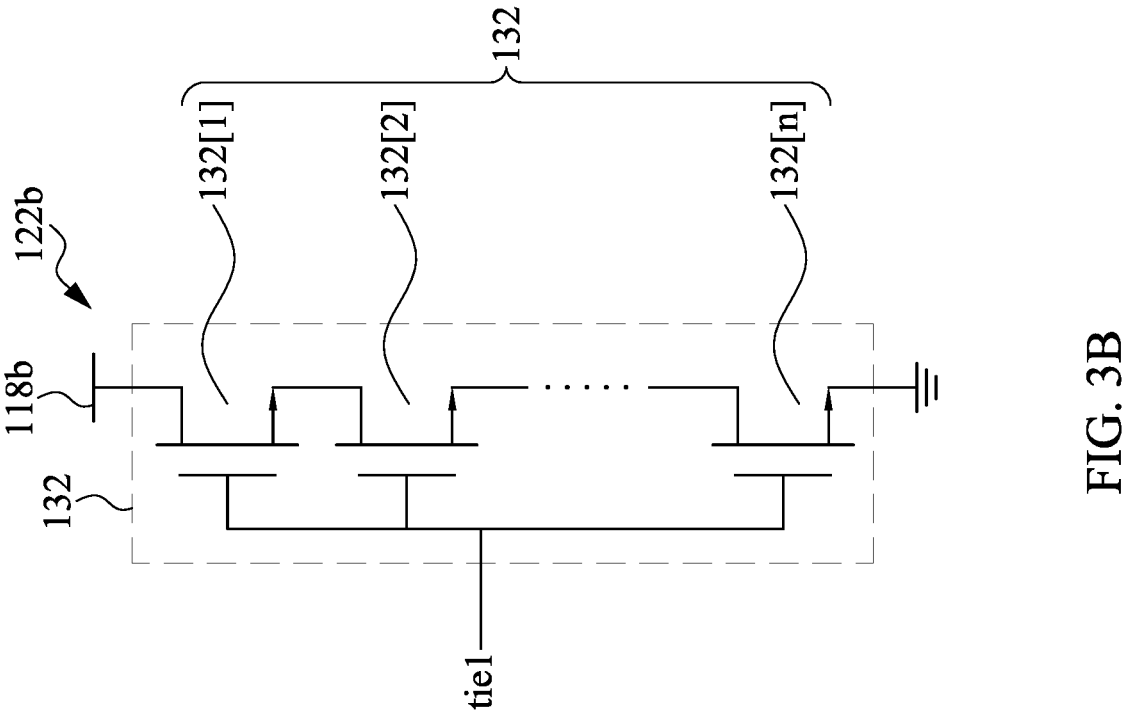
FIG. 3B is a diagram of second current source in a static current mode in accordance with some embodiments of the disclosure.
Figure 3A:
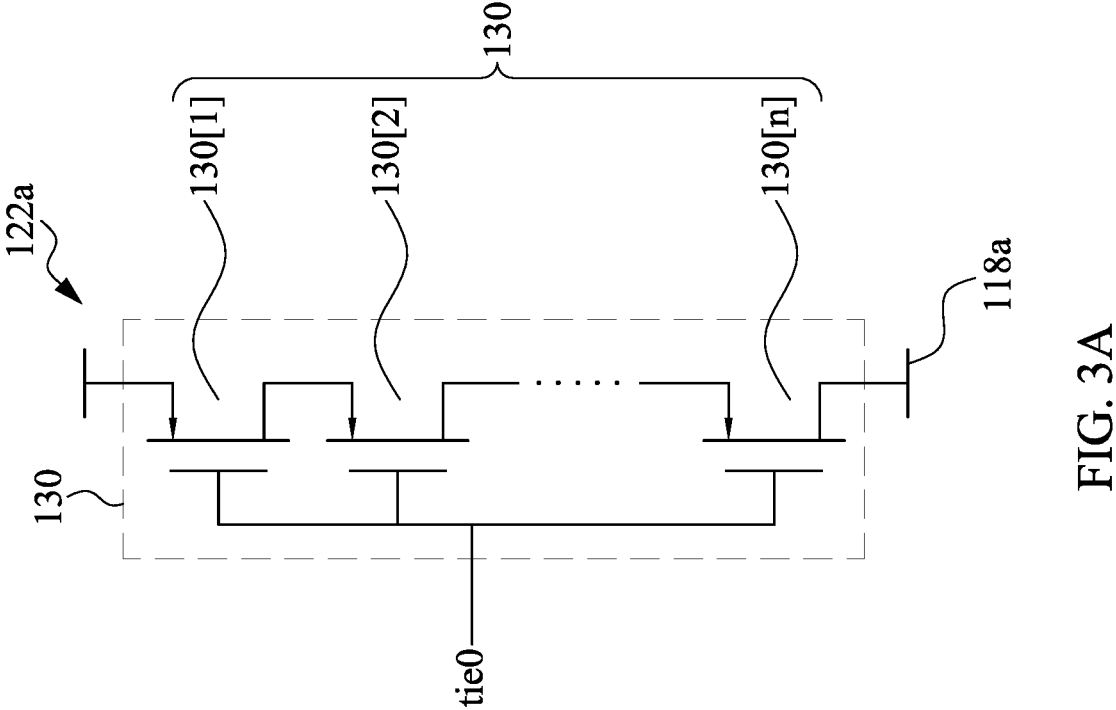
FIG. 3A is a diagram of first current source in a static current mode in accordance with some embodiments of the disclosure.

FIG. 3B illustrates an example circuit diagram of second current source 122b in the static current configuration. As shown in FIG. 3B, second current source 122b includes a plurality of second transistors 132, that is, a first second transistor 132[1], a second second transistor 132[2], . . . , and nth second transistor 132[n]. Plurality of second transistors 132 are connected in series between second node 118b and the ground. For example, a source of first second transistor 132[1] is connected to second node 118b and a drain of first second transistor 132[1] is connected to a source of second second transistor 132[2], continuing to nth second transistor 132[n] whose drain is connected to the ground. A gate of each of plurality of second transistors 132 is connected to tie 1 signal. In examples, each of plurality of second transistors 132 are symmetrical and are NMOS transistors. However, other types of transistors may be used.

A resistance value of plurality of second transistors 132 is in a range of 1K-100M ohms. However, other values are possible for plurality of second transistors 132. When the tie 1 signal rises to a logic low, each of plurality of second transistors 132 is switched ON generating a second current that is provided at second node 118b. In examples, the second current that is provided at second node 118b by second current source 122b in the static current configuration is in a range of 1 n-10 u amperes. However, other values are possible for the second current being provided at second node 118b. The second current can be varied by varying a number of transistors in plurality of second transistors 132.

Figures 4A, 4B:
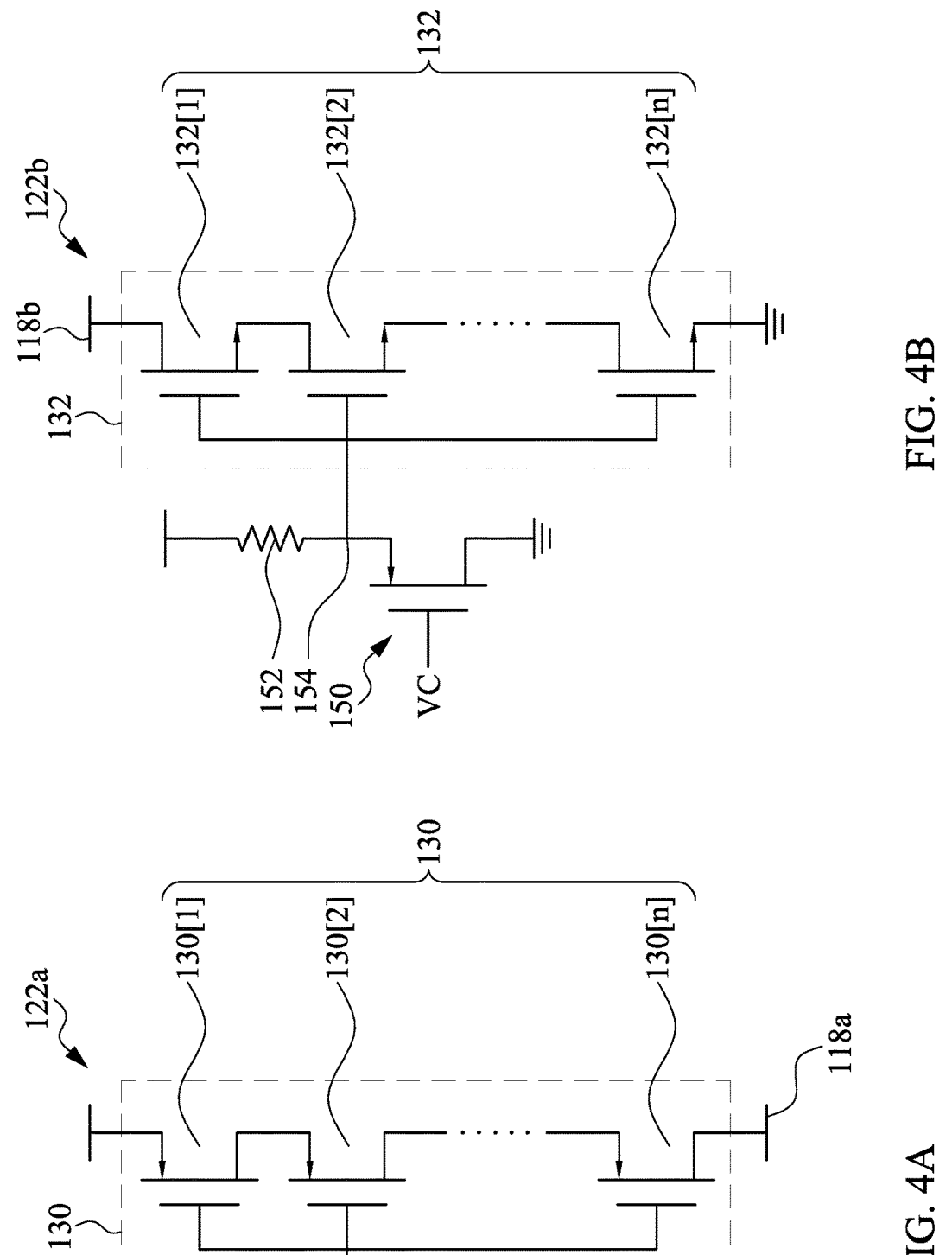
FIG. 4A is a diagram of first current source in an adaptive current mode in accordance with some embodiments of the disclosure.
FIG. 4B is a diagram of second current source in an adaptive current mode in accordance with some embodiments of the disclosure.

FIG. 4A illustrates an example circuit diagram of first current source 122a in an adaptive current configuration, also referred to as adaptive clamping current configuration. As shown in FIG. 4A, first current source 122a includes plurality of first transistors 130, that is, first first transistor 130[1], second first transistor 130[2], . . . , and nth first transistor 130[n] connected in series between the supply voltage VDD and first node 118a. In addition, first current source 122a of FIG. 4A includes a transistor 140 and a resistive element 142. A drain of transistor 140 is connected to the supply voltage and a source of transistor is connected to a first terminal of resistive element 142 at a node 144. A second terminal of resistive element is connected to first node 118a. Node 144 is connected to a gate of each of plurality of first transistors 130. A gate of transistor 140 is connected to the output terminal of comparator 108. Transistor 140 is a NMOS transistor and is symmetrical. However, other types of transistors may be used.

A resistance value of plurality of first transistors 130 is in a range of 1K-100M ohms. However, other values are possible for the resistance value of plurality of first transistors 130. A resistance value of resistor 142 is in a range of 10-100K ohms. However, other values are possible for the resistance value of resistor 142. When the voltage control signal (VC) rises to a logic high, transistor 140 is switched ON connecting node 144 to the supply voltage. This is turn switches ON each of plurality of first transistors 130 generating a first adaptive current that is provided at first node 118a. The first adaptive current provided at first node 118a is in a range of 1 n-10 u amperes. However, other values are possible for both resistive element 250 and charge storage device 252 of charge pump 110. The first adaptive current can be varied by varying the resistance value of resistive element 142 and/or by varying a number of transistors of plurality of first transistors 130.

FIG. 4B illustrates an example circuit diagram of second current source 122b in the adaptive current configuration. As shown in FIG. 4B, second current source 122b includes plurality of second transistors 132, that is, first second transistor 132[1], second second transistor 132[2], . . . , and nth second transistor 132[n] connected in series between second node 118b and the ground. In addition, second current source 122b of FIG. 4B includes a transistor 150 and a resistive element 152. A first terminal of resistive element 152 is connected to the supply voltage VDD and a second terminal of resistive element 152 is connected to a source of transistor 150 at a node 154. A drain of transistor 150 is connected to the ground. Node 154 is connected to a gate of each of plurality of second transistors 132. A gate of transistor 150 is connected to the output terminal of comparator 108. Transistor 150 is a PMOS transistor and is symmetrical. However, other types of transistors may be used.

A resistance value of plurality of second transistors 132 is in a range of 1K-100M ohms. However, other values are possible for the resistance value of plurality of second transistors 132. A resistance value of resistor 152 is in a range of 10-100K ohms. However, other values are possible for the resistance value of resistor 152. When the voltage control signal (VC) drops to a logic low, transistor 150 is switched ON connecting node 154 to the ground. This is turn switches ON each of plurality of second transistors 132 generating a second adaptive current that is provided at second node 118b. In examples, the second adaptive current provided at second node 118b is in a range of 1 n-10 u amperes. However, other values are possible for both the second adaptive current being provided at second node 118b. Second adaptive current can be varied by varying the resistance value of resistive element 152 and/or by varying a number of transistors of plurality of second transistors 132.

Figure 5:
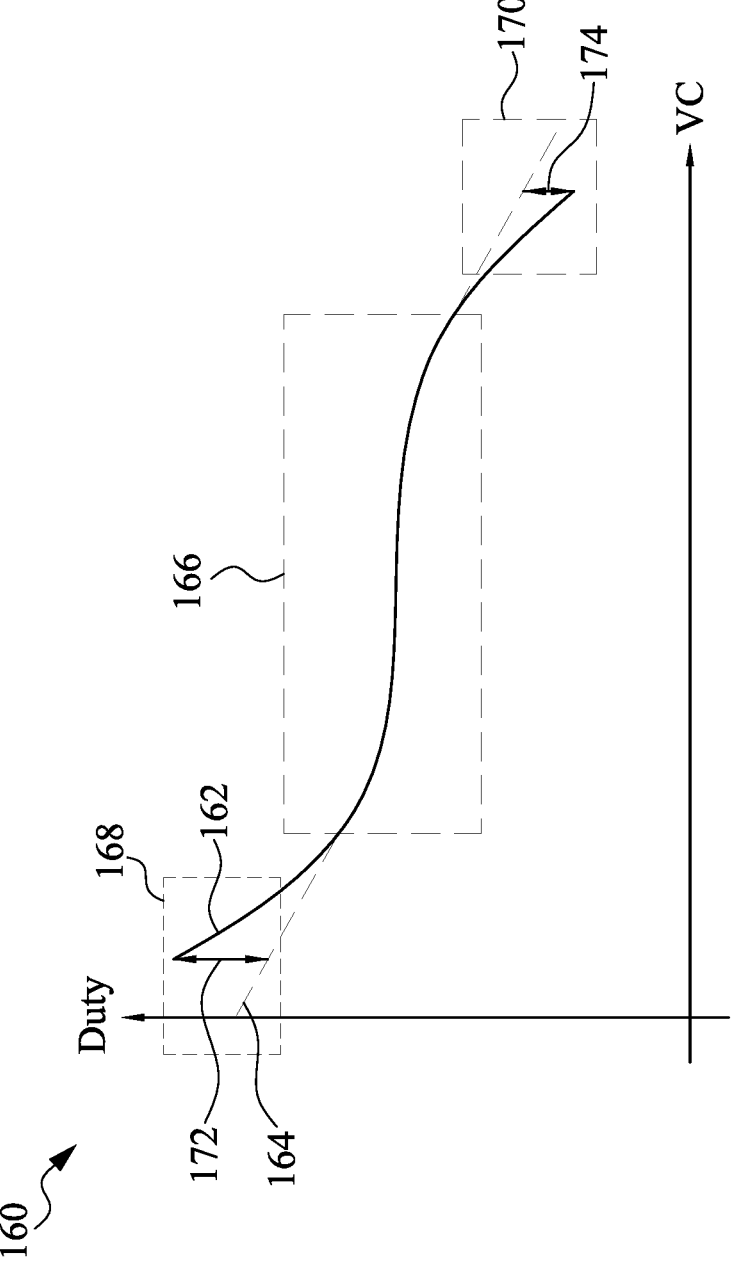
FIG. 5 is a graph illustrating relationships between a duty cycle and a control signal in accordance with some embodiments.

FIG. 5 is a graph 160 illustrating relationships between the duty cycle and the voltage control signal (VC) in accordance with some embodiments. First plot 162 of graph 160 represents the duty cycle of the output clock signal (CLK_OUT) vs the voltage control signal (VC) in DCC circuit 16 with the static clamping current. Second plot 164 of graph 160 represents the duty cycle of the output clock signal vs the voltage control signal in DCC circuit 16 with the adaptive clamping current. As shown in portion 166 of first plot 162 and second plot 164, there is a linear correlation between the duty cycle and the voltage control signal (VC) when the voltage control signal is neither too high to too low. First portion 166 may represent a section of first plot 162 where the duty cycle is approximately equal to 50%. As shown in graph 160, when the voltage control signal (VC) is too high (portion 170) or too low (portion 168), first plot 162 and second plot 164 diverge from the linear relationship with the voltage control signal, with first plot 162 diverting more from the linear relationship compared to second plot 164 (shown by gaps 172 and 174 between first plot 162 and second plot 164). Thus, the adaptive clamping current improves the functioning of DCC circuit 16 more than the static clamping current by improving the linear relationship between the duty cycle and the voltage control signal (VC). In addition, and as shown in graph 160, the adaptive clamping current improves the functioning of DCC circuit 16 more than the static clamping current when the voltage control signal is low (that is, closer to zero, (portion 168) and when it is high (portion 174). That is, (as shown in portions 168 and 170), the adaptive current clamping current improves the duty cycle vs the voltage control signal (VC) plot linearity more than that of the static clamping current.

Figure 6:
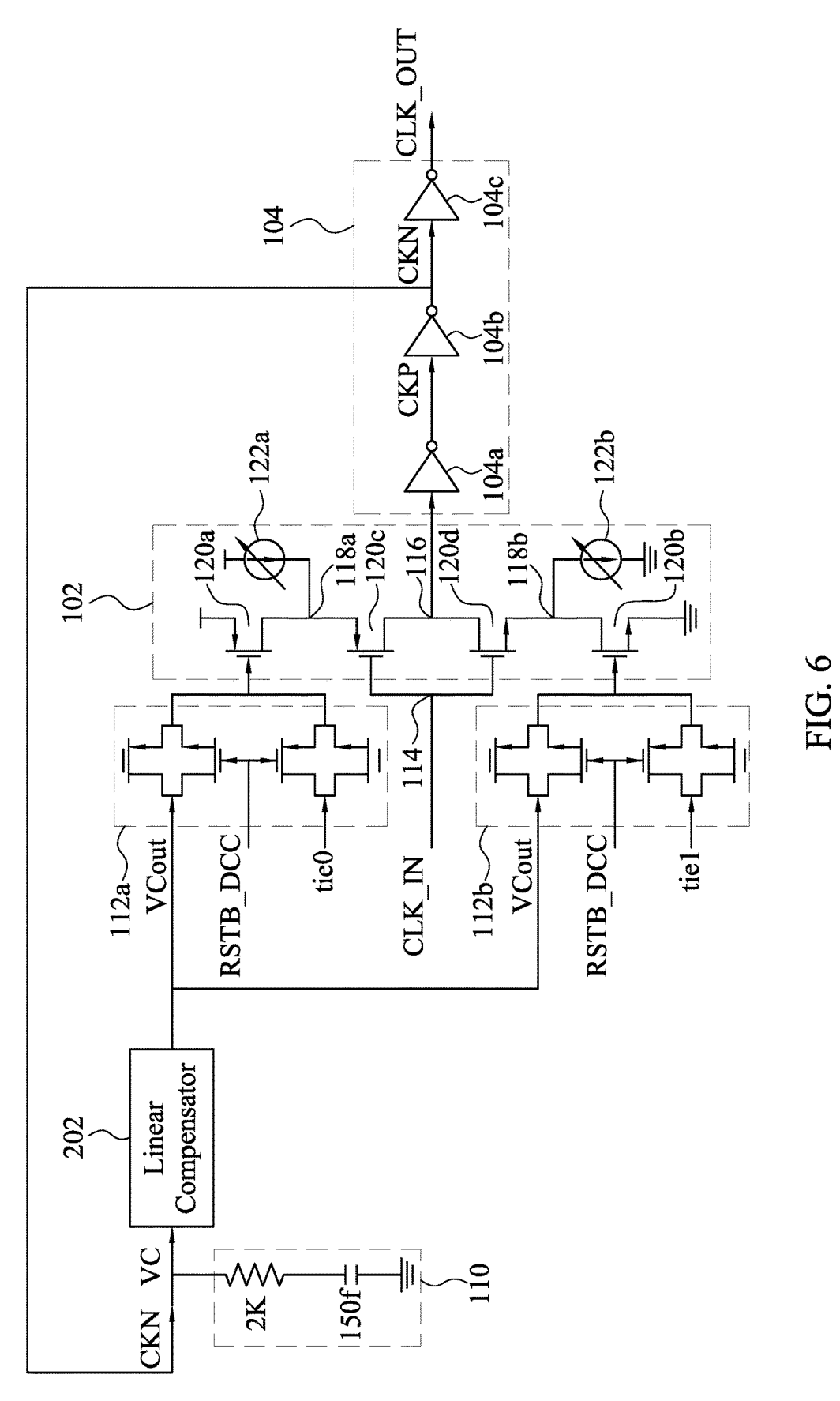
FIG. 6 is a block diagram of another DCA circuit in accordance with some embodiments of the disclosure.

FIG. 6 illustrates another DCC circuit 200 in accordance with some embodiments of the disclosure. Similar to DCC circuit 16 of FIG. 2, DCC circuit 200 provides an output clock signal (CLK_OUT) having a duty cycle approximately equal to 50% based on an input clock signal (CLK_IN). DCC circuit 200 of FIG. 6 includes DCA circuit 102, plurality of invertors 104 (that is, first invertor 104a, second invertor 104b, and third invertor 104c), loop filter 110, and plurality of bypass circuits 112 (that is, first bypass circuit 112a and second bypass circuit 112b). DCC circuit 200 further includes a linear compensator 202. Linear compensator 202 provides a linear compensation and a gain boost to single ended signal (that is, the voltage control signal (VC)).

An input terminal of linear compensator 202 is connected to an output terminal of second invertor 104b. Loop filter 110 is connected to the input terminal of linear compensator 202. An output terminal of linear compensator 202 is connected to DCA circuit 102 through first bypass circuit 112a and second bypass circuit 112b. DCC circuit 200 of FIG. 6 obviates the need for plurality of DC samplers 106 and comparator 108. For example, instead of using plurality of DC samplers 106 and comparator 108 to generate the voltage control signal (VC), DCC circuit 200 of FIG. 6 uses the inverted output clock signal (CKN) generated by second invertor 104b as the voltage control signal (VC) to adjust the duty cycle (described in greater detail with respect to FIG. 10 of the disclosure).

Figure 7:
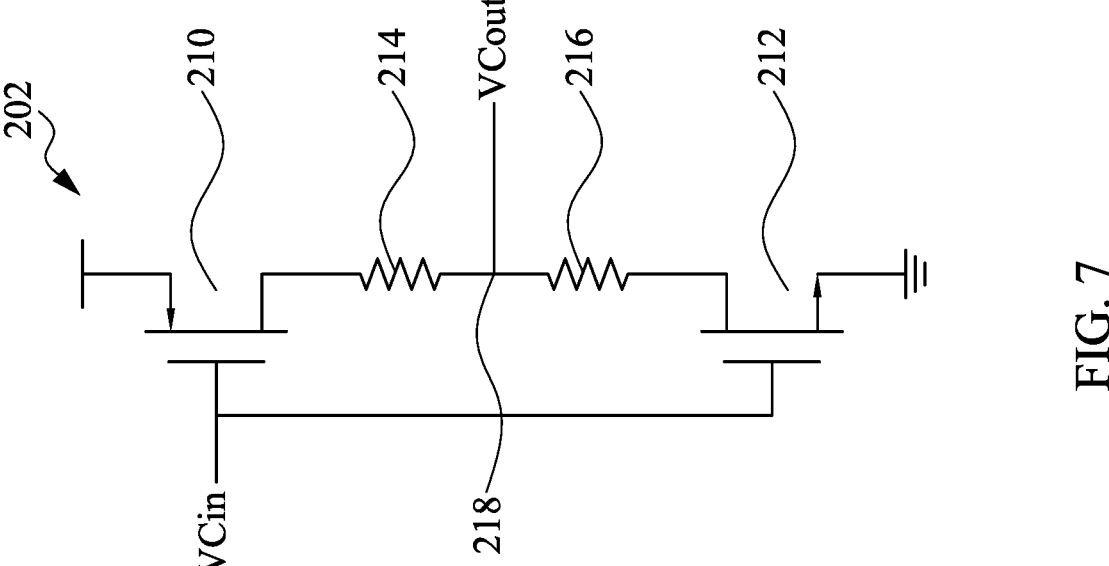
FIG. 7 is a diagram of linear compensator in accordance with some embodiments of the disclosure.

FIG. 7 illustrates an example linear compensator 202 in accordance with some embodiments. As shown in FIG. 7, linear compensator 202 includes a first transistor 210, a second transistor 212, a first resistive element 214, and a second resistive element 214. A source of first transistor 210 is connected to the power supply VDD and a drain of first transistor 210 is connected to a first terminal of first resistive element 214. A second terminal of first resistive element is connected to a first terminal of second resistive element 216 at an output node 218. A second terminal of second resistive element 216 is connected to a drain of second transistor 212. A source of second transistor 212 is connected to the ground. A gate of first transistor 210 and a gate of second transistor 212 are both connected to the input terminal of linear compensator 202. The output terminal of linear compensator 202 is connected to output node 218.

First transistor 210 is a PMOS transistor and second transistor 212 is a NMOS transistor. However, other types of transistors are within the scope of the disclosure. In addition, each of first transistor 210 and second transistor 212 is symmetrical. A resistance value of each of first resistive element 214 and second resistive element 216 can be same. In examples, the resistance value of each of first resistive element 214 and second resistive element 216 is in a range of 10-10K ohms. However, other values are possible for the resistance value of each of first resistive element 214 and second resistive element 216. Linear compensator 202 removes outlier values from the inverted output clock signal (CKN, which is used as a voltage control signal (VC) in DCC circuit 200) to generate the voltage control signal (VC) (also represented as an output voltage control signal (VCout)). For example, first resistor 214 and second resistor 216 provide a charge/discharge path for output node 218. However, when the voltage control signal (VC) is above a predetermined value (that is, too high (a logic high)), first transistor 210 is switched OFF disconnecting first resistor 214 from the supply voltage, and second transistor 212 is switched ON connecting output node 218 to the ground through second resistor 216. Therefore, the output voltage control signal (VCout) is at a logic low. In addition, when the voltage control signal (VC) is below a predetermined level (that is, too low (at a logic low), first transistor 210 is switched ON connecting output node 218 to the supply voltage through first resistor 214, and second transistor 212 is switched OFF disconnecting output node 218 from the ground. Hence, the output voltage control signal (VCout) is at a logic high when the voltage control signal (VC) is too low. Hence, there is an inverse relationship between the voltage control signal (VC) and the output voltage control signal (VCout).

Figure 8:
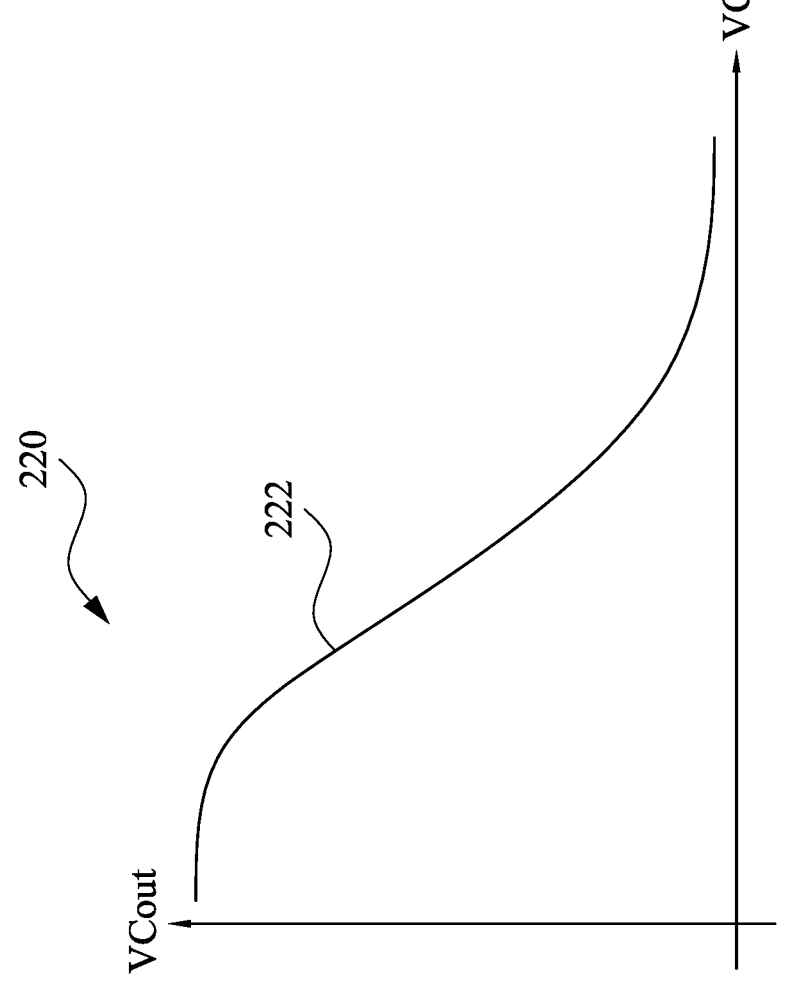
FIG. 8 is graph illustrating a relationship between an output signal and an input signal for a linear compensator in accordance with some embodiments of the disclosure.

FIG. 8 shows a graph 220 illustrating a relationship between the output control voltage signal (VCout) and the control voltage signal (VC) of linear compensator 210. For example, plot 222 of graph 210 illustrates the relationship between the output control voltage signal (VCout) which is received at the output terminal for the control voltage signal (VC) which is provided at the input terminal of linear compensator 210. As depicted in plot 222 the output voltage control signal (VCout) varies inversely with the voltage control signal (VC). That is, when the voltage control signal (VC) increases the output voltage control signal (VCout) decreases linearly.

Figure 9:
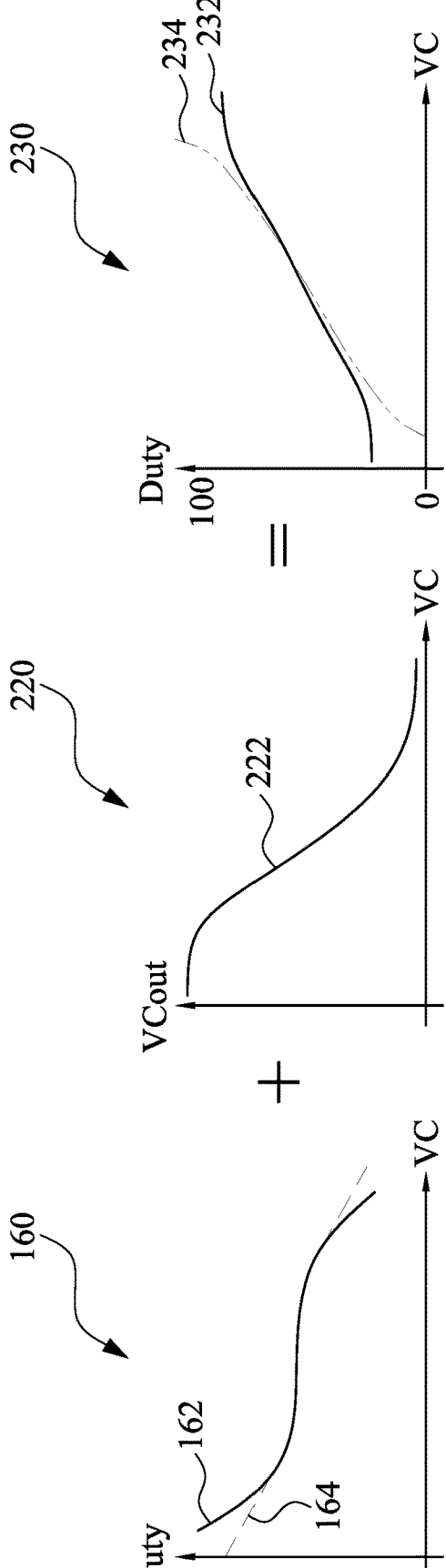
FIG. 9 shows graphs illustrating an effect on a relationship between a duty cycle and a control signal of a linear compensator in accordance with some embodiments of the disclosure.

FIG. 9 shows graphs illustrating an effect on a relationship between the duty cycle and the voltage control signal with linear compensator 202 in accordance with some example embodiments. For example, graph 160 of FIG. 9 (described with respect to FIG. 5 above) illustrates the relationship between the duty cycle and the voltage control signal without linear compensator 202. Graph 220 of FIG. 9 (described with respect to FIG. 8 above) illustrates the relationship between the voltage control signal (VC) and the output voltage control signal (VCout) of linear compensator 202. Graph 230 of FIG. 9 illustrates the relationship between the duty cycle and the voltage control signal with linear compensator 202. Graph 230 is combination of graph 160 and graph 220. For example, first plot 232 of graph 230 represents the duty cycle of the output clock signal vs the voltage control signal (VC) in DCC circuit 200 with the static clamping current and linear compensator 202. Second plot 234 of graph 230 represents the duty cycle of the output clock signal vs the voltage control signal (VC) in DCC circuit 200 with the adaptive clamping current and linear compensator 202. As shown in graph 230, the duty cycle vs the voltage control signal (VC) is more linear with presence of linear compensator 202. For example, and as shown in first plot 232 and second plot 234 of graph 230, when the voltage control signal (VC) increases, the duty cycle increases as well in a linear fashion. Thus, linear compensator 202 current improves the functioning of DCC circuit 200. For example, linear compensator 202 makes it easier to improve the duty cycle of DCC circuit 200.

Figure 10:
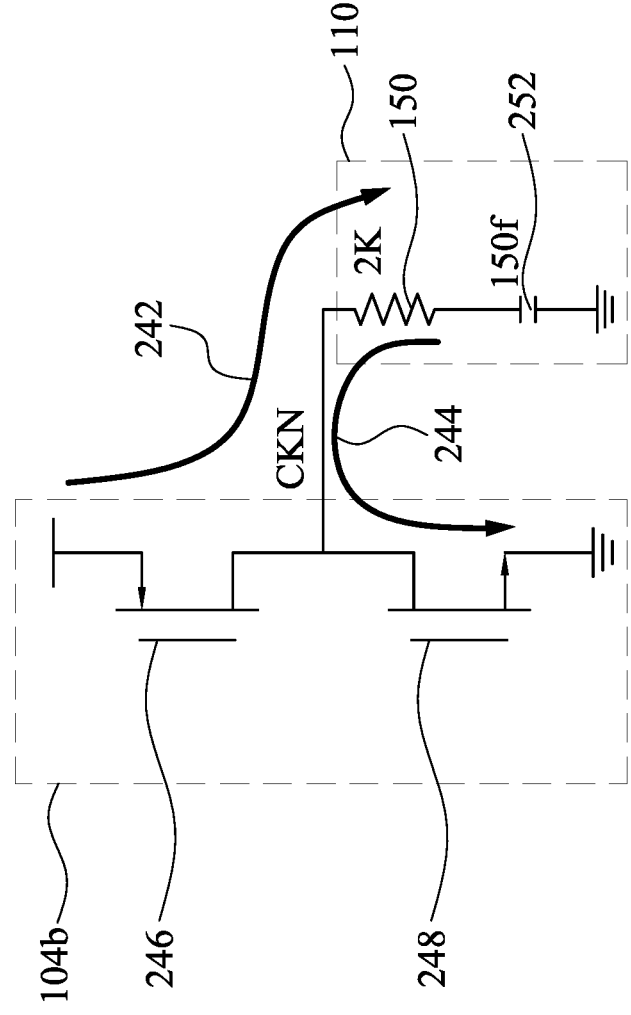
FIG. 10 is diagram illustrating charge and discharge path for a loop filter in accordance with some embodiments of the disclosure.

FIG. 10 illustrates a charge path and a discharge path for loop filter 110 during the duty cycle correction through DCC circuit 200 in accordance with some embodiments. As shown in FIG. 10, a charge path 242 and a discharge path 244 are formed through second invertor 104*b* and loop filter 110. For example, charge path 242 is formed with a current flowing through first transistor 246 of second invertor 104*b* towards charge pump 110. Discharge path 244 is formed with a current flowing through loop filter 110 towards second transistor 248 of second invertor 104*b*. In this example embodiment, a resistance value of resistive element 250 of loop filter 110 is 2K ohms and a capacitance value of charge storage device 252 of loop filter 110 is 150 f. However, other values are possible for both resistive element 250 and charge storage device 252 of charge pump 110.

In examples, an amount of charge flowing through charge path 242 is approximately equal to the amount of charge flowing through discharge path 244 when the duty cycle is approximately equal to 50%. In addition, an average of the inverted output clock signal (CKN) is approximately ½VDD when the duty cycle is approximately equal to 50%. Therefore, the amount of charge Q is determined as:

$$Q=I*t$$

A current through first transistor 246 can be determined as:

$$Ip=(VDD-\tfrac{1}{2}VDD)/(Rp+2K)$$

where Rp is a resistance value of first transistor 246 of second invertor 104*b*. A current through second transistor 248 can be determined as:

$$In=(\tfrac{1}{2}VDD)/(Rn+2K)$$

where Rn is a resistance value of second transistor 248 of second invertor 104*b*. If Rp and Rn<<2K, then:

$$Ip=In=(\tfrac{1}{2}VDD)/(Rn+2K)$$

Hence, the charge Q for both the charge path 242 and discharge path 244 will be equal.

In some examples, Rn may not be equal to Rp when there is variation in fabrication parameters used in design of either or both of first transistor 246 and second transistor 248 of second invertor 104*b*. For example, if first transistor 246 is in a fast corner and second transistor 248 is in a slow corner, the Rp is less than Rn which can cause Ip to be greater than In. In such examples, the charge Q for both charge path 242 and discharge path 244 may not be equal, and hence DCC circuit 200 of FIG. 2 may not achieve a 50% duty cycle. For such examples, the disclosure provides yet another DCC circuit 300 that neutralizes variations in the Rn and Rp.

Figure 11:
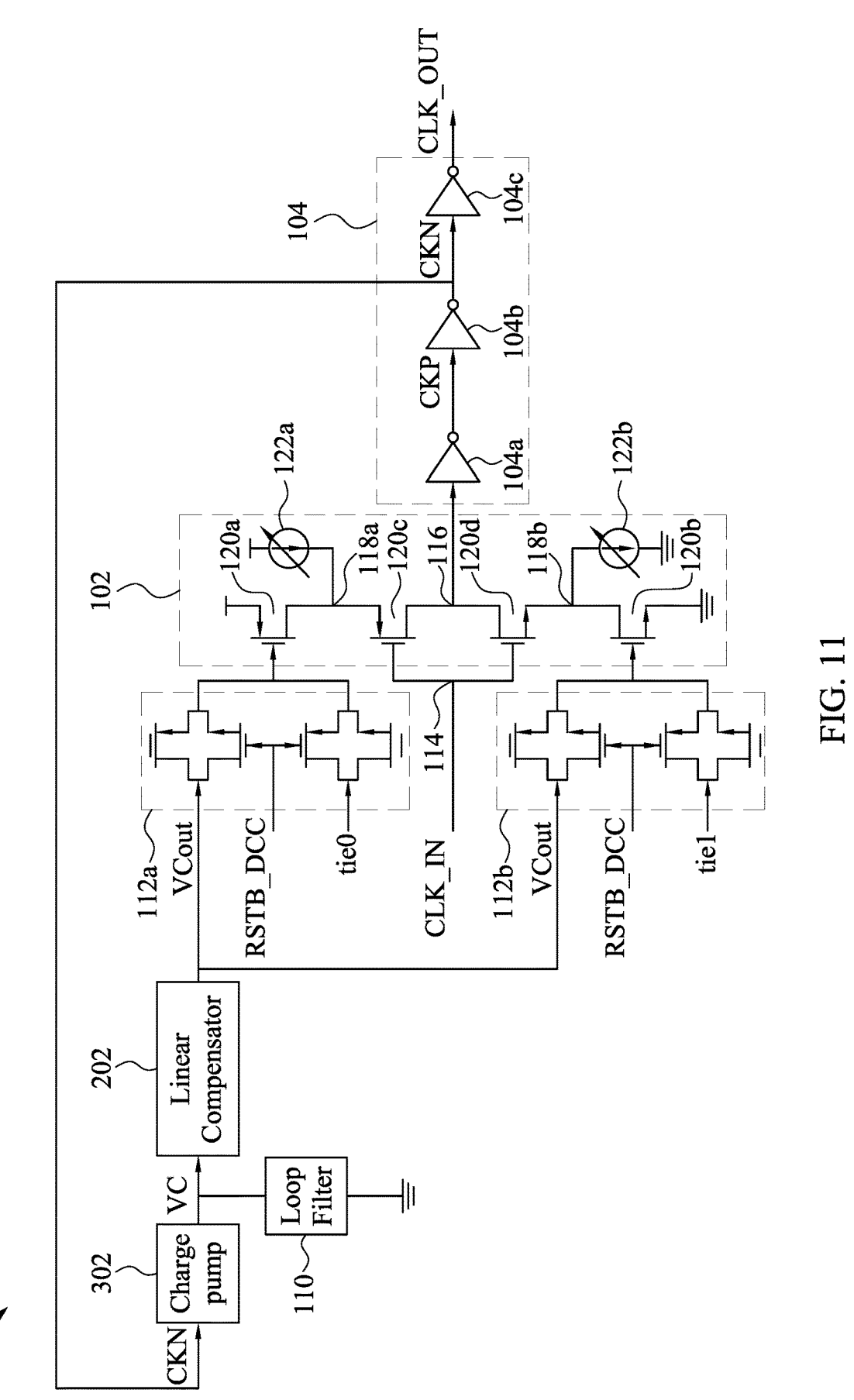
FIG. 11 is a block diagram of yet another DCA circuit in accordance with some embodiments of the disclosure.

FIG. 11 illustrates yet another DCC circuit 300 in accordance with some embodiments of the disclosure. As shown in FIG. 11, DCC circuit 300 includes DCA circuit 102, plurality of invertors 104 (for example, first invertor 104*a*, second invertor 104*b*, and third invertor 104*c*), loop filter 110, plurality of bypass circuits 112 (for example, first bypass circuit 112*a* and second bypass circuit 112*b*), and linear compensator 202. In addition, DCC circuit 300 further includes a charge pump 302. Charge pump 302 balances the current through charge path 242 and discharge path 244 for both fast and slow corners.

An input terminal of charge pump 302 is connected to the output terminal of second invertor 104*b*. An output terminal of charge pump 302 is connected to an input terminal of linear compensator 202. Loop filter 110 is connected to the input terminal of linear compensator 202. An output terminal of linear compensator 202 is connected to DCA circuit 102 through first bypass circuit 112*a* and second bypass circuit 112*b*. In examples, charge pump 302 can share components with linear compensator 202 to reduce overall number of elements. In example embodiments, charge pump 302 is configured to keep an amount of charge flowing through a charge path approximately equal to the amount of charge flowing through a discharge path when the duty cycle is approximately equal to 50%.

Figure 12:
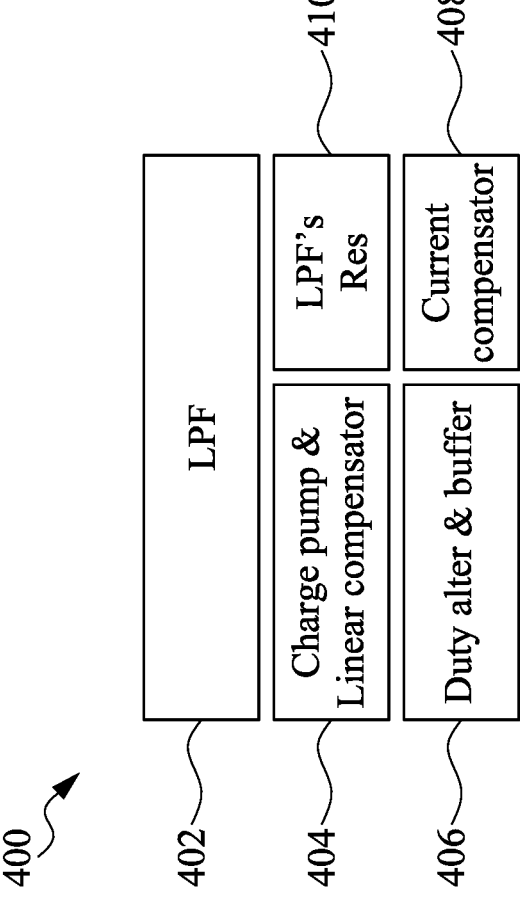
FIG. 12 is a layout diagram of DCC circuit in accordance with some embodiments of the disclosure.

FIG. 12 illustrates a layout diagram 400 in accordance with some embodiments of the disclosure. As shown in layout diagram 400, the low pass filter is formed in LPF block 402. Charge pump 302 and linear compensator 202 are formed together in block 404. Block 404 is adjacent to block 402. DCA 102 and buffer 14 are formed together in block 406. Block 406 is formed adjacent to block 404. Thus, block 404 is sandwiched between block 402 and block 406. Current compensator, that is, first current source 122*a* and second current source 122*b* are formed in block 408 which is adjacent to block 406. Resistive element of the low pass filter is formed in block 410. Block 410 is sandwiched between block 402 and block 408. In addition, block 410 is adjacent to block 404. Layout diagram 400 is an example layout, and other layouts are possible.

FIG. 13 illustrates a flow diagram of a method 500 for duty cycle correction for an input clock signal in accordance with some embodiments. In examples, method 500 can be practiced in devices and circuits discussed in this disclosure with reference to FIGS. 1-12.

At block 510 of method 500, a clock signal may be received. For example, an input clock signal may be received at DCC circuit 16 from buffer 14. In some other examples, the input clock signal may be received at DCA circuit 102 from buffer 14.

At block 520 of method 500, error amplifier 108 determines a difference between an average DC voltage value of the clock signal and an average DC voltage value of an inverted clock signal. For example, first invertor 104*a* is connected to the output terminal of DCA circuit 102. First invertor 104*a* receives inverted output clock signal from DCA 102 and inverts the inverted output clock signal to generate the output clock signal. First invertor 104*a* provides the output clock signal (CKP) as an output at an output terminal.

Second invertor 104*b* is connected to first invertor 104*a*. Second invertor 104*b* receives the output clock signal from first invertor 104*a* and inverts the output clock signal to generate the inverted output clock signal (CKN). First DC sampler 106*a* is connected to the output terminal of first invertor 104*a*. First DC sampler 106*a* determines an average DC voltage value of the output clock signal and provides the average DC voltage value of the output clock signal at an output terminal. Second DC sampler 106*b* is connected to the output terminal of second invertor 104*b*. Second DC sampler 106*b* determines an average DC voltage value of the inverted output clock signal and provides the average DC voltage value of the inverted output clock signal at an output terminal.

Error amplifier 108 is connected to both first DC sampler 106*a* and second DC sampler 106*b*. For example, a first input terminal of error amplifier 108 is connected to the output terminal of first DC sampler 106*a* and a second input terminal of error amplifier 108 is connected to the output terminal of second DC sampler 106*b*. Error amplifier 108 compares the average DC voltage value of the output clock signal with the average DC voltage value of the inverted output clock signal and provides a voltage control signal as an output based on the comparison. The voltage control signal is indicative of the difference between the average DC voltage value of the output clock signal and the average DC voltage value of the inverted output clock signal.

At block 530 of method 500, DCA 102, which is connected to error amplifier 108, adjusts a duty cycle of the output clock signal based on the determined difference between the average DC voltage value of the output clock signal and the average DC voltage value of an inverted output clock signal to approximately equal to 50%. For example, DCA 102 determines if difference between the average DC voltage value of the output clock signal and the average DC voltage value of the inverted output clock signal is substantially equal to zero. In response to determining that the difference between the average DC voltage value of the output clock signal and the average DC voltage value of the output inverted clock signal is not equal to zero, DAC 102 minimizes the difference to be substantially equal to zero to achieve the duty cycle substantially equal to 50%.

At block 540 of method 500, a current source connected to DCA 102, provides clamping current to DCA 102. For example, first current source 122*a* sinks a first current at first node 118*a* when the voltage control signal is too high. Similarly, second current source 122*b* sinks a second current at second node 118*b* when the voltage control signal is too low. The first current and the second current can be a static current or an adaptive current.

FIG. 14 illustrates a flow diagram of a method 600 for synthesizing a clock signal in accordance with some embodiments. In examples, method 600 can be practiced in devices and circuits discussed in this disclosure with reference to FIGS. 1-12.

At block 610 of method 600, an input clock signal may be received. For example, the input clock signal may be received at DCC circuit 16 from buffer 14. In some other examples, the input clock signal may be received at DCA circuit 102 from buffer 14.

At block 620 of method 600, a control signal is received by the duty cycle alterer, that is, DCA circuit 102. In examples, the control signal is received from error amplifier 108. In other examples, the control signal is received from linear compensator 202. Linear compensator 202 can generate the control signal from an inverted output clock signal. In some other examples, the inverted output clock signal is used as the control signal.

At block 630 of method 600, the duty cycle alterer, that is, DCA circuit 102 adjusts a duty cycle of the input clock signal to 50% based on the control signal. For example, DCA circuit 102 can increase or decrease the duty cycle to be approximately equal to 50%.

At block 640 of method 600, the duty cycle alterer, that is, DCA circuit 102 generates an output clock signal having the duty cycle corrected input clock signal. DCA circuit 102 provides an inverted output clock signal as an output at an output terminal.

At block 650 of method 600, a current source sinks a clamping current into the duty cycle alterer. For example, plurality of current sources 122 that are connected to DCA circuit 102 sink a clamping current into DCA circuit 102. At block 660 of method 600, the output clock signal is provided. The output clock signal has a duty cycle approximately equal to 50%.

In accordance with example embodiments, a clock synthesizer comprises: a clock buffer configured to store an input clock signal; and a Duty Cycle Corrector (DCC) circuit connected to the clock buffer, wherein the DCC circuit is configured to: receive the input clock signal from the clock buffer, receive a control signal, adjust a duty cycle of the input clock signal based on the control signal, generate an output clock signal comprising the duty cycle corrected input clock signal, and provide the output clock signal, wherein a current source is configured to sink a clamping current to the DCC circuit.

In accordance with example embodiments, a method of synthesizing clock, comprises: receiving, by a duty cycle alterer, an input clock signal; receiving, by the duty cycle alterer, a control signal; adjusting, by the duty cycle alterer, a duty cycle of the input clock signal based on the control signal; generating, by the duty cycle alterer, an output clock signal comprising the duty cycle corrected input clock signal; sinking, by a current source connected to the duty cycle alterer, a clamping current into the duty cycle alterer; and providing the output clock signal.

In accordance with some embodiments, a method of synthesizing clock, comprises: receiving a clock signal; determining, by an error amplifier, a difference between a Direct Current (DC) voltage value of the clock signal and a DC voltage value of an inverted clock signal; adjusting, by a duty cycle alterer connected to the error amplifier, a duty cycle of the clock signal based on the determined difference between the DC voltage value of the clock signal and the DC voltage value of the inverted clock signal to substantially equal; and providing, by a current source connected to the duty cycle alterer, a clamping current into the duty cycle alterer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A clock synthesizer comprising:
a clock buffer configured to store an input clock signal;
a Duty Cycle Corrector (DCC) circuit connected to the clock buffer, wherein the DCC circuit is configured to:
receive the input clock signal from the clock buffer,
receive a control signal,
adjust a duty cycle of the input clock signal based on the control signal,
generate an output clock signal comprising the duty cycle corrected input clock signal, and provide the output clock signal, wherein the DCC circuit comprises a duty cycle alterer comprising an input terminal, an output terminal, a first transistor, and a second transistor, wherein the first transistor of the duty cycle alterer is connected between a supply node and a first node of the duty cycle alterer, wherein the second transistor of the duty cycle alterer is connected between the first node and the output terminal of the duty cycle alterer, wherein a gate of the first transistor receives the control signal and a gate of the second transistor receives the input clock signal, wherein an inverted output clock signal is provided at the output terminal of the duty cycle alterer, wherein the DCC circuit further comprises a current source, and wherein the current source is connected to the first node of the duty cycle alterer and is configured to provide a clamping current at the first node of the duty cycle alterer of the DCC circuit.

2. The clock synthesizer of claim 1, wherein the DCC circuit comprises:

a first invertor connected to the output terminal of the duty cycle alterer, wherein the first invertor is operative to invert the inverted output clock signal to generate the output clock signal;

a first Direct Current (DC) sampler connected to the first invertor, wherein the first DC sampler is operative to determine an average DC voltage value of the output clock signal;

a second invertor connected to the first invertor, wherein the second invertor is operative to invert the output clock signal and provide the inverted output clock signal;

a second DC sampler connected to the second invertor, wherein the second DC sampler is operative to determine an average DC voltage value of the inverted output clock signal;

an error amplifier connected to the first DC sampler and the second DC sampler, wherein the error amplifier is operative to:

determine a difference between the average DC voltage value of the inverted clock signal and the average DC power of the clock signal, and generate the control signal based on the difference between the average DC voltage value of the inverted output clock signal and the average DC power of the output clock signal;

provide the control signal to the duty cycle alterer, wherein the duty cycle alterer is operative to adjust the duty cycle of the output clock signal based on the control signal.

3. The clock synthesizer of claim 1, wherein the control signal comprises an inverted output clock signal.

4. The clock synthesizer of claim 1, wherein the DCC circuit is operative to adjust the duty cycle to be equal to 50%.

5. The clock synthesizer of claim 1, wherein the DCC circuit is further operative to filter the control signal using a loop filter comprising a low pass filter.

6. The clock synthesizer of claim 1, wherein the DCC circuit is operative to adjust a rising edge or a falling edge of the input clock signal to adjust the duty cycle.

7. The clock synthesizer of claim 1, wherein the current source comprises a static current source.

8. The clock synthesizer of claim 1, wherein the current source comprises an adaptive current source.

9. The clock synthesizer of claim 1, wherein the DCC circuit comprises:

a first invertor connected to the output terminal of the duty cycle alterer, wherein the first invertor is operative to invert the inverted output clock signal to generate the output clock signal;

a second invertor connected to the first invertor, wherein the second invertor is operative to invert the output clock signal and provide the inverted output clock signal an output terminal; and a linear compensator connected to the output terminal of the second invertor, wherein the linear compensator is operative to:

receive the inverted output clock signal from the second invertor, generates the control signal based on the inverted output clock signal, and provide the control signal to the duty cycle alterer.

10. The clock synthesizer of claim 1, wherein the DCC circuit further comprises a loop filter connected to the output terminal of the second invertor.

11. The clock synthesizer of claim 1, wherein the DCC circuit comprises:

a first invertor connected to the output terminal of the duty cycle alterer, wherein the first invertor is operative to invert the inverted output clock signal to generate the output clock signal;

a second invertor connected to the first invertor, wherein the second invertor is operative to invert the output clock signal and provide the inverted output clock signal an output terminal;

a charge pump connected to the output terminal of the second invertor, wherein the charge pump generates a voltage control signal from the inverted output clock signal; and a linear compensator connected to an output terminal of the charge pump, wherein the linear compensator is operative to:

receive the voltage control signal from the charge pump, generates the control signal based on the voltage control signal, and provide the control signal to the duty cycle alterer.

12. The clock synthesizer of claim 11, wherein the DCC circuit further comprises a loop filter connected to the output terminal of the charge pump.

13. A method of synthesizing clock, the method comprising:

receiving, by a duty cycle alterer, an input clock signal, wherein the duty cycle alterer comprises an input terminal, an output terminal, a first transistor, and a second transistor, wherein the first transistor of the duty cycle alterer is connected between a supply node and a first node, wherein the second transistor of the duty cycle alterer is connected between the first node and the output terminal of the duty cycle alterer, and wherein a gate of the second transistor of the duty cycle alterer receives the input clock signal;

receiving, at a gate of the first transistor of the duty cycle alterer, a control signal;

adjusting, by the duty cycle alterer, a duty cycle of the input clock signal based on the control signal;

generating, by the duty cycle alterer, an output clock signal comprising the duty cycle corrected input clock signal, wherein an inverted output clock signal is provided at the output terminal of the duty cycle alterer;

providing, by a current source connected to the first node of the duty cycle alterer, a clamping current at the first node of the duty cycle alterer; and providing the output clock signal.

14. The method of claim 13, wherein receiving the control signal comprises:

determining a difference between a Direct Current (DC) voltage value of the output clock signal and a DC voltage value of the inverted output clock signal; and generating the control signal based on the determined difference.

15. The method of claim 14, wherein determining the difference between the DC voltage value of the clock signal and the DC voltage value of the inverted clock signal comprises:

generating the inverted output clock signal by inverting the output clock signal;

determining the average DC voltage value of the inverted output clock signal;

generating the output clock signal by inverting the inverted output clock signal;

determining the average DC voltage value of the output clock signal; and determining a difference between the average DC voltage value of the inverted clock signal and the average DC power of the clock signal.

16. The method of claim 13, wherein receiving the control signal comprises determining the control signal from the inverted output clock signal.

17. The method of claim 13, wherein providing the clamping current at the first node of the duty cycle alterer comprises providing a static clamping current at the first node of the duty cycle alterer.

18. The method of claim 13, wherein providing the clamping current at the first node of the duty cycle alterer comprises providing an adaptive clamping current at the first node of the duty cycle alterer.

19. A method of synthesizing clock, the method comprising:

receiving a clock signal;

determining, by an error amplifier, a difference between a Direct Current (DC) voltage value of the clock signal and a DC voltage value of an inverted clock signal;

adjusting, by a duty cycle alterer connected to the error amplifier, a duty cycle of the clock signal based on the determined difference between the DC voltage value of the clock signal and the DC voltage value of the inverted clock signal to substantially equal, wherein the duty cycle alterer comprises an input terminal, an output terminal, a first transistor, and a second transistor, wherein the first transistor of the duty cycle alterer is connected between a supply node and a first node, wherein the second transistor of the duty cycle alterer is connected between the first node and the output terminal of the duty cycle alterer, wherein a gate of the first transistor receives the control signal and a gate of the second transistor receives the clock signal, wherein an inverted output clock signal is provided at the output terminal of the duty cycle alterer, and wherein the duty cycle alterer further comprises a current source connected to the first node of the duty cycle alterer; and providing, by the current source connected to the first node of the duty cycle alterer, a clamping current at the first node of the duty cycle alterer.

20. The method of claim 19, wherein determining the difference between the DC voltage value of the clock signal and the DC voltage value of the inverted clock signal comprises:

generating, by a first invertor connected to a phase interpolator, an inverted clock signal by inverting the clock signal;

determining, by a first Direct Current (DC) sampler connected to the first invertor, an average DC voltage value of the inverted clock signal;

generating, by a second invertor connected to the first invertor, the clock signal by inverting the inverted clock signal;

determining, by a second DC sampler connected to the second invertor, an average DC voltage value of the clock signal; and determining, by the error amplifier connected to the first DC sampler and the second DC sampler, a difference between the average DC voltage value of the inverted clock signal and the average DC power of the clock signal.

* * * * *